(12) United States Patent
Okabe et al.

(10) Patent No.: US 11,908,873 B2
(45) Date of Patent: Feb. 20, 2024

(54) ACTIVE MATRIX SUBSTRATE, DISPLAY DEVICE, AND MOTHERBOARD

(71) Applicant: SHARP KABUSHIKI KAISHA, Sakai (JP)

(72) Inventors: Tohru Okabe, Sakai (JP); Ryosuke Gunji, Sakai (JP); Shinji Ichikawa, Sakai (JP); Shinsuke Saida, Sakai (JP); Shoji Okazaki, Sakai (JP); Tokuo Yoshida, Sakai (JP); Hiroki Taniyama, Sakai (JP); Kohji Ariga, Sakai (JP); Hiroharu Jinmura, Yonago (JP); Akira Inoue, Yonago (JP); Yoshihiro Nakada, Yonago (JP); Yoshihiro Kohara, Yonago (JP); Koji Tanimura, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 487 days.

(21) Appl. No.: 17/270,399

(22) PCT Filed: Aug. 23, 2018

(86) PCT No.: PCT/JP2018/031172
§ 371 (c)(1),
(2) Date: Feb. 22, 2021

(87) PCT Pub. No.: WO2020/039554
PCT Pub. Date: Feb. 27, 2020

(65) Prior Publication Data
US 2021/0225881 A1 Jul. 22, 2021

(51) Int. Cl.
*H01L 27/12* (2006.01)
*H01L 27/02* (2006.01)
(Continued)

(52) U.S. Cl.
CPC ...... *H01L 27/1244* (2013.01); *H01L 27/0255* (2013.01); *H01L 27/0266* (2013.01); *H01L 27/124* (2013.01); *H10K 59/131* (2023.02)

(58) Field of Classification Search
CPC .. H01L 27/124; H01L 27/1244; H10K 59/131
See application file for complete search history.

(56) References Cited

U.S. PATENT DOCUMENTS 5,734,458 A * 3/1998 Ikubo ............... G02F 1/13452
349/149
9,287,329 B1 * 3/2016 Lee ................. H10K 50/8426
(Continued)

FOREIGN PATENT DOCUMENTS

CN 206020893 U * 3/2017
JP H3-2838 * 1/1991
(Continued)

OTHER PUBLICATIONS

Machine translation, Chai, WIPO Pat. Pub. No. WO 2014205858A1, translation date: Aug. 16, 2023, Clarivate Analytics, all pages. (Year: 2023).*

(Continued)

*Primary Examiner* — Victoria K. Hall
(74) *Attorney, Agent, or Firm* — ScienBiziP, P.C.

(57) ABSTRACT

An active matrix substrate including a resin substrate including a plurality of external connection terminals arranged near a display region, the active matrix substrate includes: a plurality of first lead wires each extending from one of the external connection terminals to the display region; and a plurality of second lead wires each extending from one of the external connection terminals to a separation line, the second lead wires being arranged with an arrangement pitch (Continued)

along the separation line, and the arrangement pitch of the second lead wires being greater than an arrangement pitch of the first lead wires.

14 Claims, 13 Drawing Sheets

(51) Int. Cl.
*H01L 27/32* (2006.01)
*H10K 59/131* (2023.01)

(56) References Cited

U.S. PATENT DOCUMENTS

| | | | |
|---|---|---|---|
| 9,761,560 B2* | 9/2017 | Lee | G02F 1/13452 |
| 10,504,931 B2* | 12/2019 | Zhou | H01L 21/768 |
| 2003/0030054 A1* | 2/2003 | Hector | G02F 1/136204 |
| | | | 257/355 |
| 2011/0018142 A1* | 1/2011 | Kawamura | G02F 1/136286 |
| | | | 257/776 |
| 2011/0024754 A1 | 2/2011 | Yamazaki | |
| 2012/0212684 A1* | 8/2012 | Ochiai | H01L 27/124 |
| | | | 348/790 |
| 2015/0077675 A1* | 3/2015 | Chien | G02F 1/13452 |
| | | | 349/42 |
| 2016/0172428 A1* | 6/2016 | Song | H10K 59/131 |
| | | | 257/40 |
| 2016/0172623 A1* | 6/2016 | Lee | B32B 27/32 |
| | | | 257/40 |
| 2016/0179229 A1* | 6/2016 | Ahn | G06F 3/0443 |
| | | | 345/173 |
| 2017/0194411 A1* | 7/2017 | Park | H10K 59/131 |
| 2019/0006442 A1* | 1/2019 | Byun | H10K 59/124 |
| 2019/0019441 A1* | 1/2019 | Shin | H10K 71/70 |

FOREIGN PATENT DOCUMENTS

| | | | |
|---|---|---|---|
| JP | H032838 A | | 1/1991 |
| JP | H0756184 A | | 3/1995 |
| JP | 2004-266079 A | * | 9/2004 |
| JP | 2004266079 A | | 9/2004 |
| JP | 2004538512 A | | 12/2004 |
| JP | 2006-317592 A | * | 11/2006 |
| JP | 2006317592 A | | 11/2006 |
| JP | 2007-25081 A | * | 2/2007 |
| JP | 2007025081 A | | 2/2007 |
| JP | 2011028115 A | | 2/2011 |
| JP | 2012-68422 A | * | 4/2012 |
| JP | 2012068422 A | | 4/2012 |
| WO | WO-2014205858 A1 | * | 12/2014 |

OTHER PUBLICATIONS

Machine translation, Xian, Chinese Pat. Pub. No. CN-206020893-U, translation date: Aug. 16, 2023, Clarivate Analytics, all pages. (Year: 2023).*
Machine translation, Sato, Japanese Pat. Pub. No. JP2007-25081A, translation date: Aug. 15, 2023, Espacenet, all pages. (Year: 2023).*
Machine translation, Senda, Japanese Pat. Pub. No. JPH03-2838, translation date: Aug. 15, 2023, Espacenet, all pages. (Year: 2023).*
Machine translation, Sumi, Japanese Pat. Pub. No. JP2012-68422A, translation date: Aug. 15, 2023, Espacenet, all pages. (Year: 2023).*
Machine translation, Tajima, Japanese Pat. Pub. No. JP2006-317592A, translation date: Aug. 15, 2023, Espacenet, all pages. (Year: 2023).*
Machine translation, Yamazaki, Japanese Pat. Pub. No. JP2004-266079A, translation date: Aug. 15, 2023, Espacenet, all pages. (Year: 2023).*

* cited by examiner

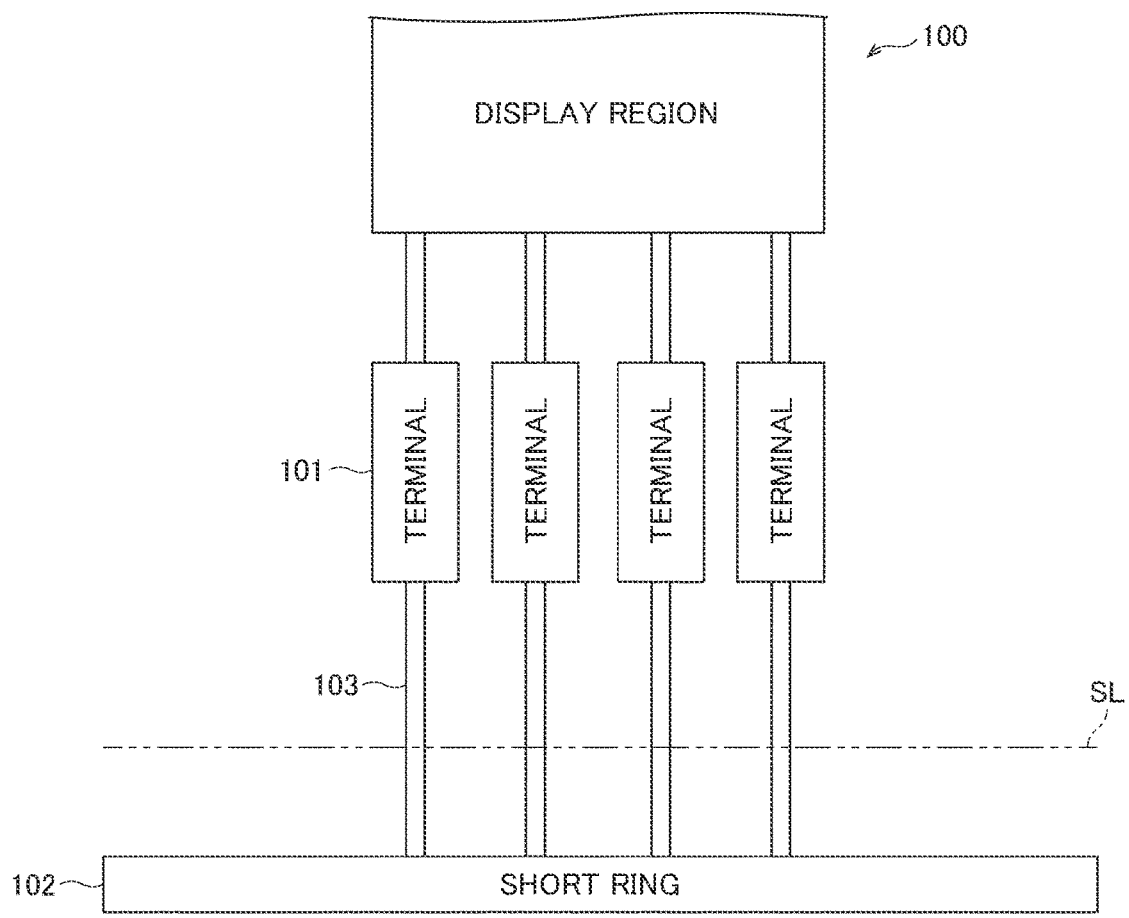

US 11,908,873 B2

ACTIVE MATRIX SUBSTRATE, DISPLAY DEVICE, AND MOTHERBOARD

TECHNICAL FIELD

The disclosure relates to an active matrix substrate including a plurality of external connection terminals arranged near a display region, a display device, and a method for manufacturing the active matrix substrate.

BACKGROUND ART

A display device, such as an organic electroluminescence (EL) display device, includes many terminals near a display region. These terminals are connected to external connection substrates including a flexible printed circuit (FPC).

Until the terminals are connected to such a substrate as an FPC in the manufacturing process of the display device, the manufacturing steps proceed with these many terminals exposed near an active matrix substrate. Here, if the display device is, for example, a liquid crystal display device, a pixel drive element is broken by static caused in the rubbing of an alignment film that controls an alignment direction of liquid crystals. The broken drive element frequently causes faulty characteristics of the device.

Hence, Patent Document 1 discloses an array substrate 100 designed with a known technique. As illustrated in FIG. 13, all the terminals are connected to a conductor or a semiconductor referred to as a short ring 102, and short-circuited. The short ring 102 prevents damage caused by static produced in the manufacturing process. Note that, immediately before terminals 101 of the display device are connected to a not-shown external connection substrate, the short ring 102 is separated along a separation line SL from electrical leads 103 each extending from one of the terminals 101 to the short ring 102.

CITATION LIST

Patent Literature

[Patent Document 1] Japanese Unexamined Patent Application Publication No. 2007-025081

SUMMARY

Technical Problem

Recent display devices such as organic EL display devices provide images with high definition, and that is why the terminal spacing and the electrical-lead spacing are set narrowly. The narrow spacing causes a problem below when the electrical leads are separated with, for example, a laser beam.

That is, when the electrical leads are connected to a known short ring, the electrical leads are arranged with a pitch distance between the terminals maintained. Hence, the electrical-lead spacing along the separation line is significantly narrow. The short ring can be physically separated on a glass substrate. On a flexible substrate made of such a material as polyimide, however, the short ring is separated with, for example, a laser beam or a diamond cutter. In such a case, polyimide burns black to be carbon, becomes electrically conductive, and causes an electric leak between the terminals.

In view of the above known problem, an aspect of the disclosure is intended to provide an active matrix substrate, a display device, and a mother substrate capable of preventing a leak between terminals.

Solution to Problem

An active matrix substrate according to an aspect of the disclosure includes a resin substrate including a plurality of external connection terminals arranged near a display region. The active matrix substrate includes: a plurality of first lead wires each extending from one of the external connection terminals to the display region; and a plurality of second lead wires each extending from one of the external connection terminals to a separation line. The second lead wires are arranged with an arrangement pitch along the separation line, and the arrangement pitch of the second lead wires is greater than an arrangement pitch of the first lead wires.

A display apparatus according to an aspect of the disclosure includes the active matrix substrate. The separation line coincides with an end face of a display panel included in the display device.

A mother substrate according to an aspect of the disclosure includes a plurality of active matrix substrates planarly arranged and including the active matrix substrate.

Advantageous Effects of Disclosure

An aspect of the disclosure provides an active matrix substrate, a display device, and a mother substrate capable of preventing a leak between terminals.

BRIEF DESCRIPTION OF DRAWINGS

FIG. 13 is a plan view illustrating a configuration of a known active matrix substrate.

DESCRIPTION OF EMBODIMENTS

First Embodiment

Described below is an embodiment of the disclosure, with reference to FIGS. 1 to 4.

Basic Configuration of Display Region of Organic EL Substrate

Figure 2:
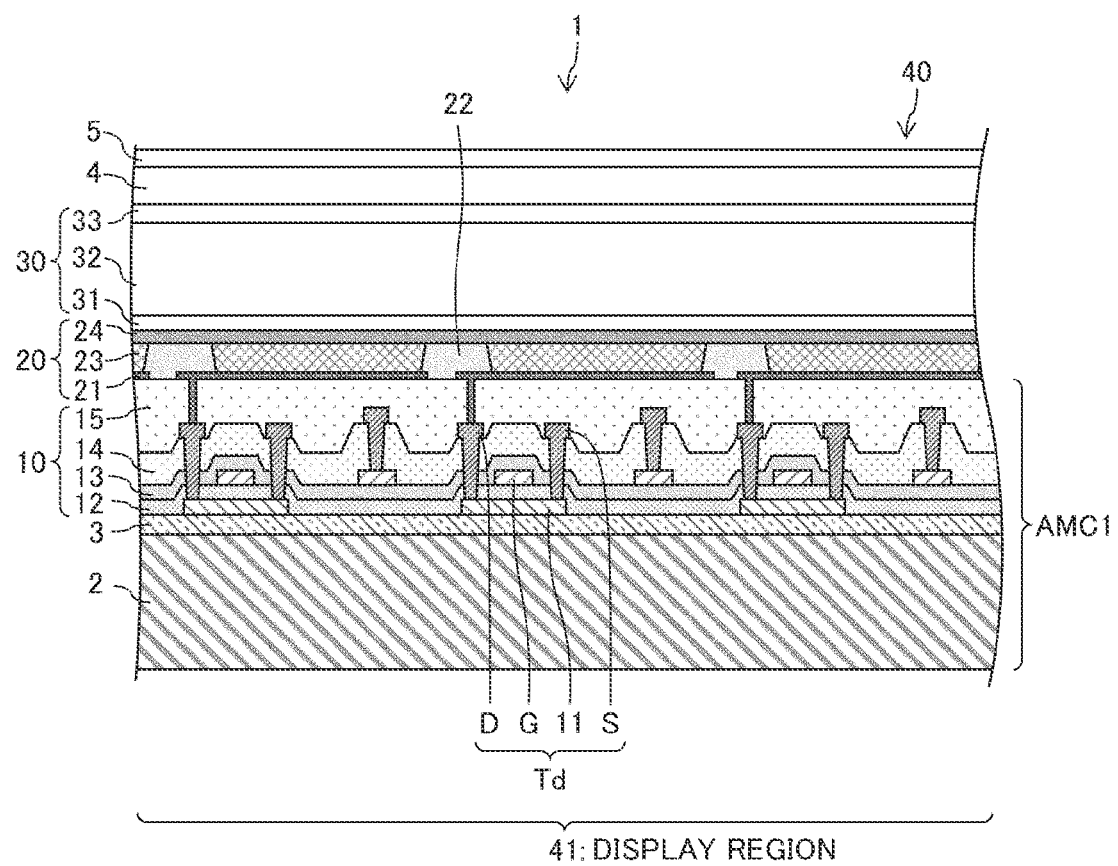
FIG. 2 is a cross-sectional view illustrating a configuration of a display region, of an EL display device, including the active matrix substrate.
Figure 3:
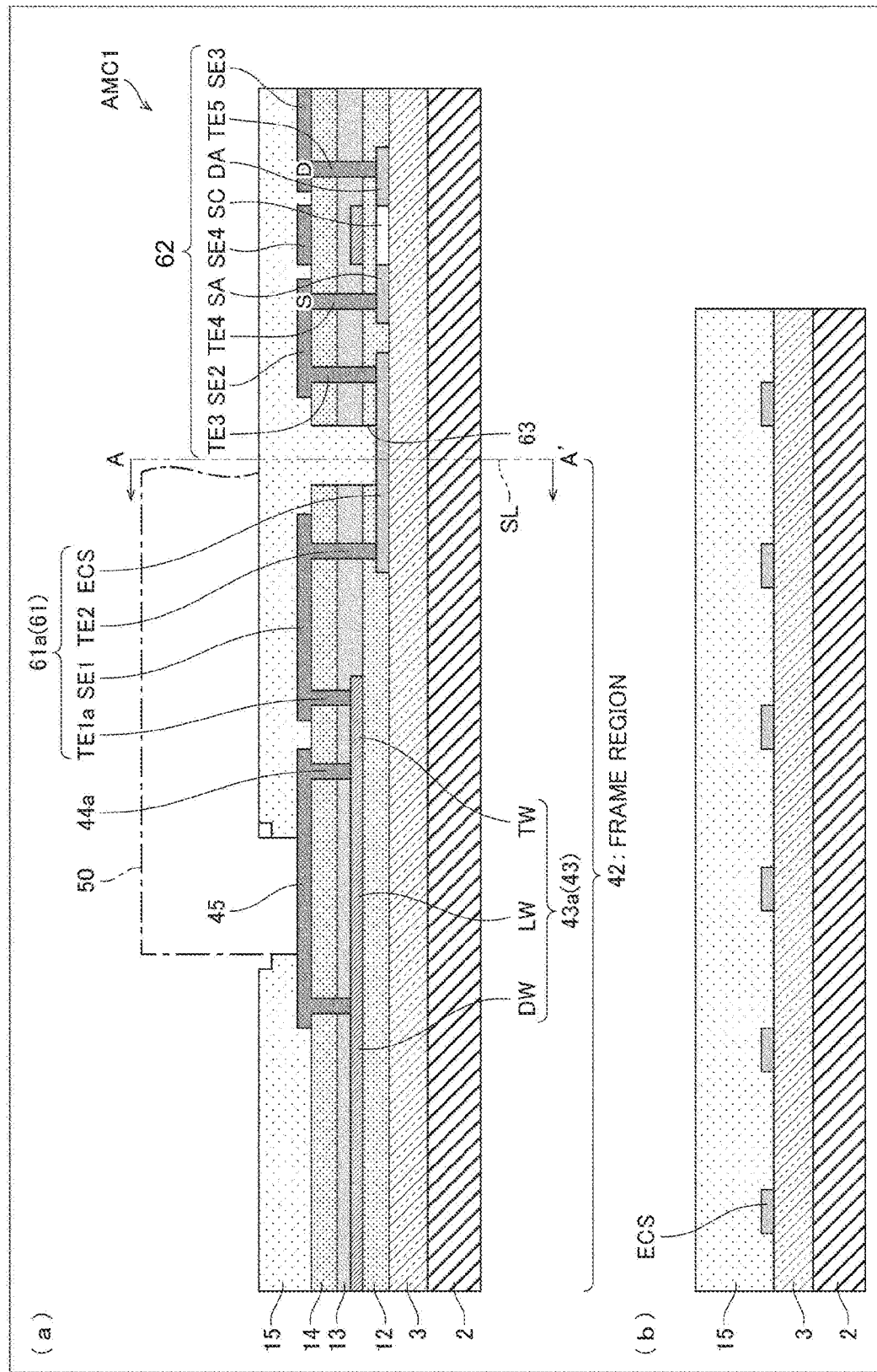
FIG. 3(a), illustrating an end of the active matrix substrate except the display region, is a cross-sectional view of a first lead wire formed in a same layer as a gate terminal is formed.
FIG. 3(b) is a cross-sectional view, taken along arrows A-A' in FIG. 3(a).
Figure 4:
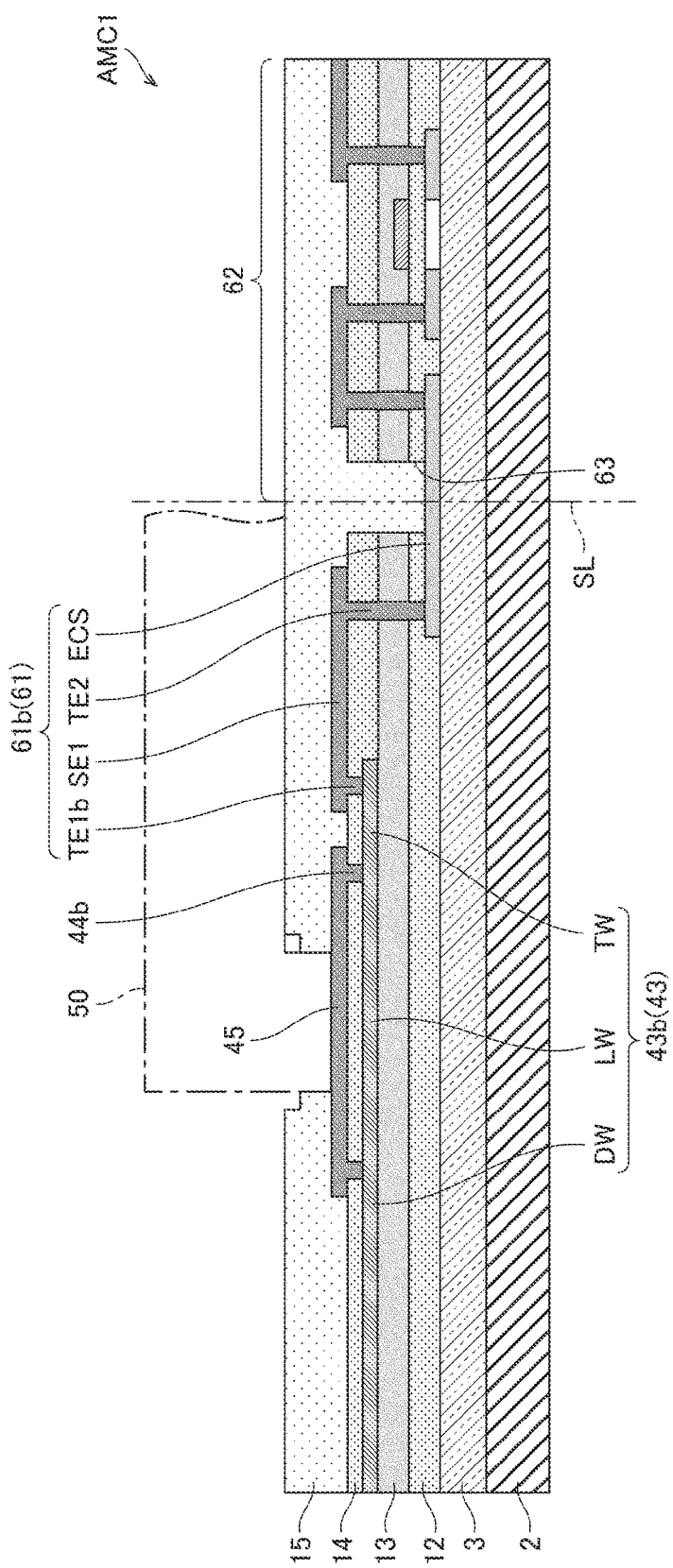
FIG. 4, illustrating an end of the active matrix substrate except the display region, is a cross-sectional view of a first lead wire formed in, the a same layer as a metal film is formed to extend from a source electrode and a drain electrode.

Described below with reference to FIGS. 2 to 4 is a cross-sectional structure of a display panel 40, of an organic EL display device 1, including an active matrix substrate AMC 1 according to this embodiment. FIG. 2 is a cross-sectional view illustrating a configuration of a display region 41, of an organic EL display device 1, included in the display panel 40. FIG. 3(a), illustrating an end of the active matrix substrate of the organic EL display device 1 except the display region 41, is a cross-sectional view of a first lead wire 43a formed in the same layer as a gate terminal G is formed. FIG. 3(b) is a cross-sectional view, taken along arrows A-A' in FIG. 3(a). FIG. 4, illustrating an end of the active matrix substrate of the organic EL display device 1 except the display region 41, is a cross-sectional view of a first lead wire 43b formed in the same layer as a metal film formed to extend from a source electrode S and a drain electrode D.

As illustrated in FIG. 2, the display region 41 of the display panel 40 includes from below: a resin substrate 2; a barrier layer 3 acting as a second inorganic insulating film; a thin film transistor (TFT) layer 10; a light-emitting element layer 20; a sealing layer 30; a bonding layer 4; and a functional film 5 in the stated order.

The resin substrate 2, the barrier layer 3, and the TFT layer 10 constitute the active matrix substrate AMC 1 according to this embodiment.

As examples, materials of the resin substrate 2 include such resins as polyimide, epoxy, and polyamide. In this embodiment, polyimide is used.

When the display device is in use, the barrier layer 3 keeps water and impurities from reaching the TFT layer 10 and the light-emitting element layer 20. An example of the barrier layer 3 can be a silicon oxide film or a silicon nitride film formed by the chemical-vapor deposition (CVD), or a multilayer film including those films.

The TFT layer 10 includes: a semiconductor film 11; an inorganic insulating film 12 formed above the semiconductor film 11; a gate electrode G formed above the inorganic insulating film 12; an inorganic insulating film 13 formed above the gate electrode G; a not-shown capacitance line formed above the inorganic insulating film 13; an inorganic insulating film 14 formed above the capacitance line; the source electrode S and the drain electrode D formed above the inorganic insulating film 14; and a planarization film 15 formed above the source electrode S and the drain electrode D.

The semiconductor film 11, the inorganic insulating film 12 acting as a gate insulating film, and the gate electrode G constitute a thin film transistor Td functioning as a light-emission control transistor. The source electrode S and the drain electrode D are respectively connected to a source region and a drain region of the semiconductor film 11.

The semiconductor film 11 is formed of, for example, low-temperature polysilicon (LTPS) or an oxide semiconductor. Note that, in FIG. 2, the TFT including the semiconductor film 11 as a channel is of a top gate structure. Alternatively, the TFT may be of a bottom gate structure when, for example, the channel of the TFT is an oxide semiconductor.

The inorganic insulating films 12, 13, and 14 can be, for example, a silicon oxide (SiOx) film, or a silicon nitride (SiNx) film formed by the CVD, or a multilayer film including these films. The planarization film 15, functioning as an interlayer insulating film, may be made of applicable and light-sensitive organic materials such as polyimide and acrylic.

The gate electrode G, the source electrode S, the drain electrode D, and terminals are a monolayer metal film formed of at least one of such metals as aluminum (Al), tungsten (W), molybdenum (Mo), tantalum (Ta), chromium (Cr), titanium (Ti), and copper (Cu), or a multilayer metal film formed of these metals.

The light-emitting element layer 20 in this embodiment is, for example, an organic light-emitting diode (OLED) layer. The light-emitting element layer 20 includes: an anode electrode 21 formed above the planarization film 15; a pixel bank 22 defining a sub-pixel of the display region 41 that the light-emitting element layer 20 overlaps; a light-emitting layer 23 formed above the anode electrode 21; and a cathode electrode 24 formed above the light-emitting layer 23. An OLED is formed to include the anode electrode 21, the light-emitting layer 23, and the cathode electrode 24.

The pixel bank 22 covers an edge of the anode electrode 21. The light-emitting layer 23 is formed, by vapor deposition or an ink jet method, in a light-emitting region surrounded with the pixel bank 22. If the light-emitting element layer 20 is an OLED layer, for example, a hole-injection layer, a hole-transport layer, the light-emitting layer 23, an electron-transport layer, and an electron-injection layer are stacked on top of another on a bottom face, of the pixel bank 22, where the anode electrode 21 is exposed. Here, the layers other than the light-emitting layer 23 may be a common layer.

The anode electrode (a positive electrode) 21 includes, for example indium tin oxide (ITO) and an alloy containing silver (Ag) stacked on top of another. The anode electrode 21 reflects light. The cathode electrode 24 can be formed of a translucent conductive material such as ITO or indium zinc oxide (IZO).

If the light-emitting element layer 20 is the OLED layer, holes and electrons recombine together in the light-emitting layer 23 by a drive current between the anode electrode 21 and the cathode electrode 24, which forms an exciton. While the exciton transforms to the ground state, light is released. Since the cathode electrode 24 is translucent and the anode electrode 21 is light-reflective, the light emitted from the light-emitting layer 23 travels upward. This is how the organic EL display device 1 is of a top emission type.

The light-emitting element layer 20 does not have to be formed of an OLED element. Alternatively, the light-emitting element layer 20 may be formed of an inorganic light-emitting diode or a quantum dot light-emitting diode.

The sealing layer 30 is formed above the light-emitting element layer 20. The sealing layer 30 is translucent, and includes: an inorganic sealing film 31 covering the cathode electrode 24 of the light-emitting element layer 20; an organic sealing film 32 formed above the inorganic sealing film 31; and an inorganic sealing film 33 covering the organic sealing film 32.

An example of the inorganic sealing films 31 and 33 can be a silicon oxide film, a silicon nitride film, or a silicon oxide nitride film formed by the chemical-vapor deposition (CVD) using a mask, or a multilayer film including these films.

The organic sealing film 32 is a light-transparent organic film thicker than the inorganic sealing films 31 and 33, and may be made of applicable and light-sensitive organic materials such as polyimide and acrylic. For example, ink containing such an organic material is applied to the inorganic sealing film 31 by an ink jet technique, and cured with an ultraviolet ray.

Hence, the sealing layer 30 covers the light-emitting element layer 20, and prevents such foreign objects as water and oxygen from penetrating into the light-emitting element layer 20.

The functional film 5 has such functions as optical compensation, touch sensing, and protection. The functional film 5 is bonded with the bonding layer 4.

Configuration of End of Active Matrix Substrate and Frame Region of Display Panel The display panel 40 includes a frame region 42 and the active matrix substrate AMC 1 both having an end provided with a first lead wire 43 extending from internal wiring of the display region 41, as illustrated in FIG. 3. That is, the first lead wire 43 is electrically connected to various kinds of the internal wiring in the TFT layer 10 illustrated in FIG. 2. Hence, the first lead wire 43 includes two kinds of wires for the sake of the manufacturing steps; namely, a first lead wire 43a and a first lead wire 43b, depending on which internal wire in the TFT layer 10 the first lead wire 43 is connected to.

Specifically, for example, the first lead wire 43a is connected to a not-shown gate wire provided in the display region 41 and connected to the gate electrode G. As illustrated in FIG. 3, the first lead wire 43a includes: an internal lead wire DW; a relay wire LW; and a terminal wire TW.

The internal lead wire DW is formed to extend from the not-shown gate wire. The relay wire LW and the terminal wire TW are formed in the same step as the gate electrode G, and the gate wire are formed. Hence, the internal lead wire DW, the relay wire LW, and the terminal wire TW are made of the same material as the gate electrode G is made, and are formed on the inorganic insulating film 12. Specifically, each of the internal lead wire DW, the relay wire LW, and the terminal wire TW is a monolayer film or a multilayer film formed of at least one of the metals stated before.

The terminal wire TW of the first lead wire 43a is connected to a through electrode 44a formed through the inorganic insulating films 13 and 14. Connected to this through electrode 44a is a terminal 45 acting as an external connection terminal. The terminal 45 is connected, for example, to not-shown terminals of a flexible printed circuit (FPC) 50 and a semiconductor chip. Note that the terminal 45 has a top face covered with the planarization film 15. The top face has a portion exposed to be connected to the FPC 50.

Meanwhile, the first lead wire 43b is led from the source electrode S and the drain electrode D in the internal wiring of the TFT layer 10 illustrated in FIG. 2. Here, the source electrode S and the drain electrode D are formed after the inorganic insulating film 13 is formed. Hence, as illustrated in FIG. 4, the first lead wire 43b is also formed on the inorganic insulating film 13.

As illustrated in FIG. 4, the first lead wire 43b includes: the internal lead wire DW; the relay wire LW; and the terminal wire TW, as the first lead wire 43a includes.

The internal lead wire DW is formed to extend from the source electrode S and the drain electrode D. The relay wire LW and the terminal wire TW are formed in the same step as the source electrode S and the drain electrode D are formed. Hence, each of the internal lead wire DW, the relay wire LW, and the terminal wire TW is a metal monolayer film or a metal multilayer film made formed of the same materials as the gate electrode G and the drain electrode D are formed, and is provided on the inorganic insulating film 13.

As illustrated in FIG. 4, the terminal wire TW of the first lead wire 43b is connected to a through electrode 44b formed through the inorganic insulating film 14. Connected to this through electrode 44b is the terminal 45. The terminal 45 is connected to not-shown terminals of the FPC 50 and a semiconductor chip.

Short Ring

In the manufacturing process of the active matrix substrate AMC 1, a plurality of terminals 45, including the terminal 45, are externally exposed before such components as the FPC 50 are attached to the terminals 45. Hence, static produced in the manufacturing process breaks a pixel drive element, and the broken drive element frequently causes faulty characteristics of the organic EL display device 1.

Hence, in the process of manufacturing the active matrix substrate AMC 1, a second lead wire 61 illustrated in FIGS. 3 and 4 is formed to externally extend from each terminal 45. This second lead wire 61 is connected to a conductor or a semiconductor referred to as a short ring 62, and short-circuited. Hence, the short ring 62, a conductor or a semiconductor, is provided to have all the terminals 45 short-circuited, so that, when static is produced, the short ring 62 discharges the static. At the end of the manufacturing process, this short ring 62 is separated as the second lead wire 61 is separated along a separation line SL. Each second lead wire 61 is separated in a predetermined position with a laser beam or a diamond cutter. The separation line SL is a line through which the separated second lead wires 61 are imaginarily connected together in the separated positions.

A configuration of the second lead wire 61 is described, with reference to FIGS. 3 and 4.

As illustrated in FIG. 3, if the first lead wire 43a is connected to the gate electrode G, a second lead wire 61a is formed as the second lead wire 61.

The second lead wire 61a illustrated, in FIG. 3 includes: a first through electrode TE1a connected to the terminal wire TW of the first lead wire 43a; an internal lead line. SE1 connected to another end of the first through electrode TE1a; a second through electrode TE2 connected to another end of the internal lead line SE1; and a conductive semiconductor layer ECS connected to another end of the second through electrode TE2. The first through electrode TE1a penetrates the inorganic insulating films 13 and 14. The second through electrode TE2 penetrates the inorganic insulating films 13 and 14, and a portion of the inorganic insulating film 12.

The first through electrode TE1a, the internal lead line SE1, and the second through electrode TE2 included in the second lead wire 61a are made of a metal film. The conductive semiconductor layer ECS included in the second lead wire 61a is made of a conductive semiconductor layer.

Meanwhile, a second lead wire 61b illustrated in FIG. 4 includes: a first through electrode TE1b connected to the terminal wire TW of the first lead wire 43b: the internal lead line SE1 connected to another end of the first through electrode TE1b; the second through electrode TE2 connected to another end of the internal lead line SE1; and the conductive semiconductor layer ECS connected to another end of the second through electrode TE2. The first through electrode TE1b penetrates the inorganic insulating film 14. The second through electrode TE2 penetrates the inorganic insulating films 13 and 14, and a portion of the inorganic insulating film 12.

The first through electrode TE1a, the internal lead line SE1, and the second through electrode TE2 included in the second lead wire 61b are made of a metal film. The conductive semiconductor layer ECS included in the second lead wire 61b is made of a conductive semiconductor layer.

As a result, the only difference between the second lead wire 61a and the second lead wire 61b is the one between the first through electrode TE1a and the second through electrode TE1b.

Next, formed outside the second lead wires 61a and 61b is the short ring 62 made of a conductor or a semiconductor.

The short ring 62 illustrated in FIGS. 3 and 4 includes: a third through electrode TE3 connected to the second lead wire 61a or the second lead wire 61b; an external lead line SE2 connected to the third through electrode TE3; a fourth through electrode TE4 connected to another end of the external lead line SE2; a source region SA connected to the fourth through electrode TE4; a semiconductor layer SC connected to the source region SA; a drain region DA connected to the semiconductor layer SC; a fifth through electrode TE5 connected to an end of the drain region DA; and a redundant lead line SE3 connected to another end of the fifth through electrode TE5. A gate terminal is formed above the semiconductor layer SC through the inorganic insulating film 12. Moreover, a lead branch line SE4 is formed above the gate terminal through the inorganic insulating films 12 and 14.

This short ring 62, to which the second lead wire 61a or the second lead wire 61b is connected, is either a conductor or a semiconductor as described before. Hence, each of the second lead wire 61a and the second lead wire 61b is short-circuited with the short ring 62.

At the end of the manufacturing process, the second lead wires 61a and 61b are separated with a not-shown laser beam or diamond cutter along the separation line SL through which predetermined separation positions are imaginarily connected together as illustrated in FIGS. 3 and 4.

Hence, as illustrated in FIGS. 3 and 4 in this embodiment, a slit 63 is formed of the inorganic insulating films 12, 13, and 14 (i.e., a first inorganic insulating film) along the separation line SL across the second lead wires 61a and 61b in a plan view. The slit 63 exposes the second lead wires 61a and 61b. Moreover, along the separation line SL across the second lead wires 61a and 61b in a plan view, the planarization film 15 fills the slit 63 to cover the second lead wires 61a and 61b.

When the second lead wires 61a and 61b are separated with a laser beam along the separation line SL in a plan view, the planarization film 15 made of resin can be readily cut with a laser beam or a diamond cutter.

Here, pitches between the second lead wires arranged across the separation line are conventionally the same as those between the first lead wires. Recent display devices, however, provide images with high definition, and that is why the terminal spacing and the electrical-lead spacing are set narrowly. A short ring region can be physically separated on a glass substrate. On a flexible substrate made of such a material as polyimide, the short ring region is separated with, for example, a laser beam and a diamond cutter. In such a case, polyimide burns black to be carbon, becomes electrically conductive, and causes an electric leak between the terminals.

Figure 1:
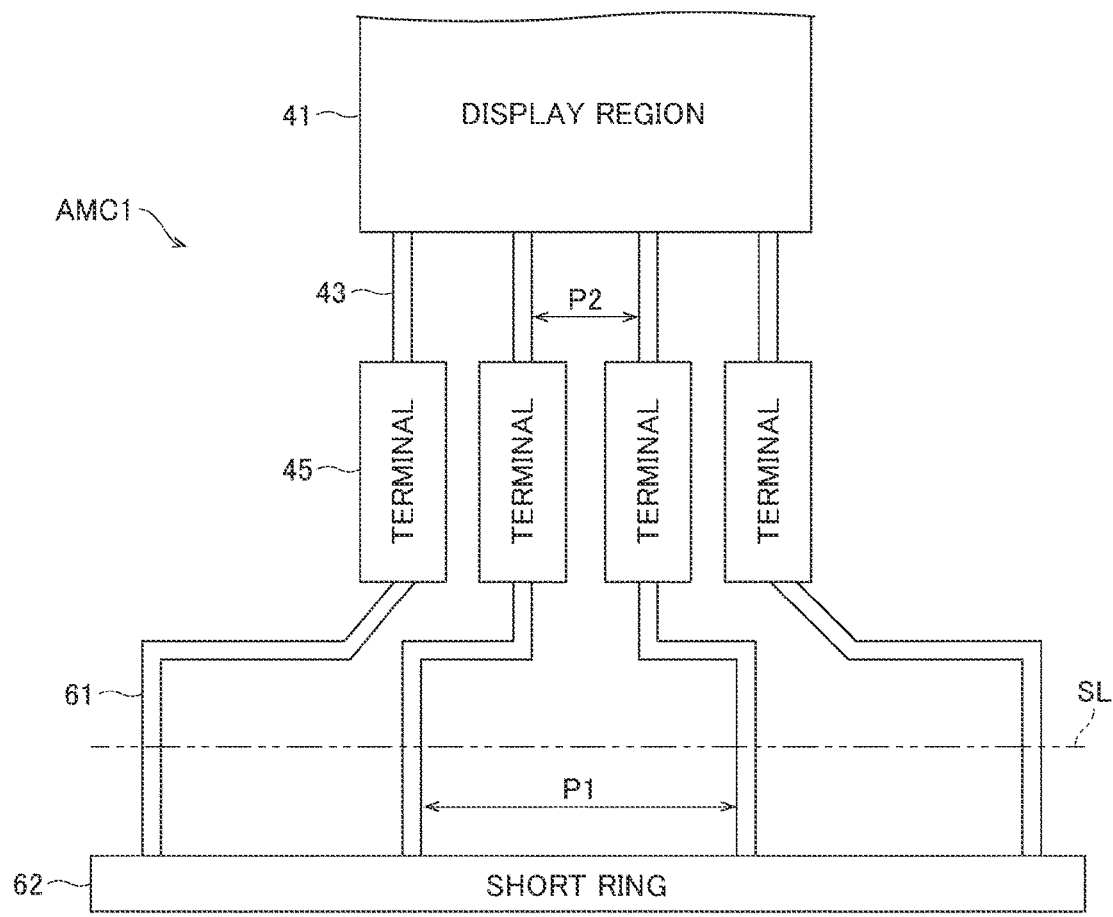
FIG. 1 is a plan view illustrating a main configuration of an active matrix substrate according to a first embodiment of the disclosure.

Hence, the active matrix substrate AMC 1 according to this embodiment has a configuration illustrated in FIG. 1. FIG. 1 is a plan view illustrating a main configuration of the active matrix substrate AMC 1 according to this embodiment.

That is, in the active matrix substrate AMC 1 of this embodiment illustrated in FIG. 1, the second lead wires 61 are arranged with an arrangement pitch P1 along the separation line SL. The arrangement pitch P1 is greater than an arrangement pitch P2 of the first lead wires 43.

As a result, the active matrix substrate AMC 1 can prevent an electric leak between the terminals 45.

Hence, the active matrix substrate AMC 1 according to this embodiment includes the terminals 45 as external connection terminals arranged near the display region 41. The active matrix substrate AMC 1 includes: the first lead wires 43 each extending from one of the terminals 45 to the display region 41; and the second lead wires 61 each extending from one of the terminals 45 to the separation line SL. The second lead wires 61 are arranged with the arrangement pitch P1 along the separation line SL. The arrangement pitch P1 is greater than the arrangement pitch P2 of the first lead wires 43 extending from the terminals 45. Note that, if the arrangement pitch P2 of the first lead wires 43 includes a plurality of arrangement pitches P2, and the arrangement pitch P1, of the second lead wires 61, along the separation line SL includes a plurality of arrangement pitches P1, the smallest pitches of the respective arrangement pitches P2 and P1 are compared.

For example, if the active matrix substrate AMC 1 includes a resin substrate, the resin is carbonized to be electrically conductive as the resin substrate is separated, and remained as carbon. The carbonized resin could cause an electric leak between the terminals 45.

In this embodiment, however, the arrangement pitch P1, of the second lead wires 61, along the separation line SL is greater than the arrangement pitch P2 of the first lead wires 43 extending from the terminals 45. Hence, even if the resin of the resin substrate is carbonized when the resin substrate is separated with, for example, a laser beam, the carbonized resin is less likely to remain across the first lead wires 43.

As a result, the active matrix substrate AMC 1 can prevent an electric leak between the terminals 45.

Moreover, the active matrix substrate AMC 1, according to this embodiment, includes the inorganic insulating films 12 to 14 and the planarization film 15 stacked on top of another in the stated order on the second lead wires 61a and 62b. The inorganic insulating films 12 to 14 act as a first inorganic insulating film, and the planarization film 15 is made of resin. The active matrix substrate AMC 1 includes the slit 63 formed of the inorganic insulating films 12 to 14 along the separation line SL across the second lead wires 61a and 61b in a plan view. The slit 63 exposes the second lead wires 61a and 61b. Along the separation line SL across the lead wires 61a and 61b in a plan view, the planarization film 15 fills the slit 63 to cover the second lead wires 61a and 61b.

When the second lead wires 61a and 61b are separated with a laser beam along the separation line SL in a plan view, only the planarization film 15 made of resin is found above the second lead wires 61a and 61b. As a result, the second lead wires 61a and 61b are readily cut with a laser beam along the separation line SL.

The active matrix substrate AMC 1 according to this embodiment includes the barrier layer 3 as a second inorganic insulating film formed below, and in contact with, the second lead wires 61*a* and 61*b*. The resin substrate 2 is formed below the barrier layer 3.

Such a configuration is the same as that of the display region 41 included in the active matrix substrate AMC 1. As a result, the second lead wires 61*a* and 61*b* can be readily formed in a step of forming the display region 41 of the active matrix substrate AMC 1.

Such a feature makes it possible to form the second lead wires 61*a* and 61*b* without newly adding a different step, contributing to readily forming the second lead wires 61*a* and 61*b*.

In the active matrix substrate AMC 1 according to this embodiment, the second lead wires 61*a* and 61*b* across the separation line SL are conductive, and formed of the same material as the semiconductor layer is formed. Such a feature allows the second lead wires 61*a* and 61*b* to readily function as a conductive material.

In the active matrix substrate AMC 1 according to this embodiment, the second lead wires 61*a* and 61*b* include an internal lead line SE1 made of a metal film formed of the same material, and in the same layer, as a metal wire in the display region 41 is formed. As a result, in a step of forming the display region 41 of the active matrix substrate AMC 1, the internal lead line SE1 is formed in the same steps of (i) forming the gate electrode as a metal wire and (ii) forming the source electrode as a metal wire connected to the source region and the drain electrode as a metal wire connected to the drain region. Such a feature makes it possible to readily form the second lead wires 61*a* and 61*b* including the internal lead line SE1 made of a metal film.

The organic EL display device 1 as a display device according to this embodiment includes the active matrix substrate AMC 1. The separation line SL coincides with a display panel end face 40*a* (see FIG. 8 to be shown later) included in the organic EL display device 1. Such a feature allows the organic EL display device 1 to include the active matrix substrate AMC 1 capable of preventing an electric leak between the terminals 45.

Second Embodiment

Described below is another embodiment of the disclosure, with reference to FIGS. 5 to 7. This embodiment and the first embodiment share the same configurations except a configuration described in this embodiment. Like reference signs designate identical or corresponding components throughout the drawings between this embodiment and the first embodiment, and therefore will not be elaborated upon here.

The difference between an active matrix substrate AMC 2 of this embodiment and the active matrix substrate AMC 1 of the first embodiment is that the former includes the configuration of the latter, and further includes a short ring 70 provided with a ring transistor.

Described below is a configuration of the active matrix substrate AMC 2 according to this embodiment, with reference to FIGS. 5 to 7. FIG. 5 is a plan view illustrating a configuration of a first short ring 71*a* and a second short ring 71*b* of the active matrix substrate AMC 2 according to this embodiment. FIG. 6 is a plan view illustrating a configuration of a first short ring 72*a* and a second short ring 72*b* of the active matrix substrate AMC 2 according to this embodiment. FIG. 7 is a plan view illustrating a configuration of a first short ring 73*a* and a second short ring 73*b* of the active matrix substrate AMC 2 according to this embodiment.

As illustrated in FIG. 1, for example, suppose the short ring 62 is a single conductor or a single semiconductor, or is made only of a conductor partially including a semiconductor. If one of the terminals 45 produces static and the static flows into the second lead wire 61*a*, the static might backflow into the second lead wire 61*b* through the short ring 62.

Figure 5:
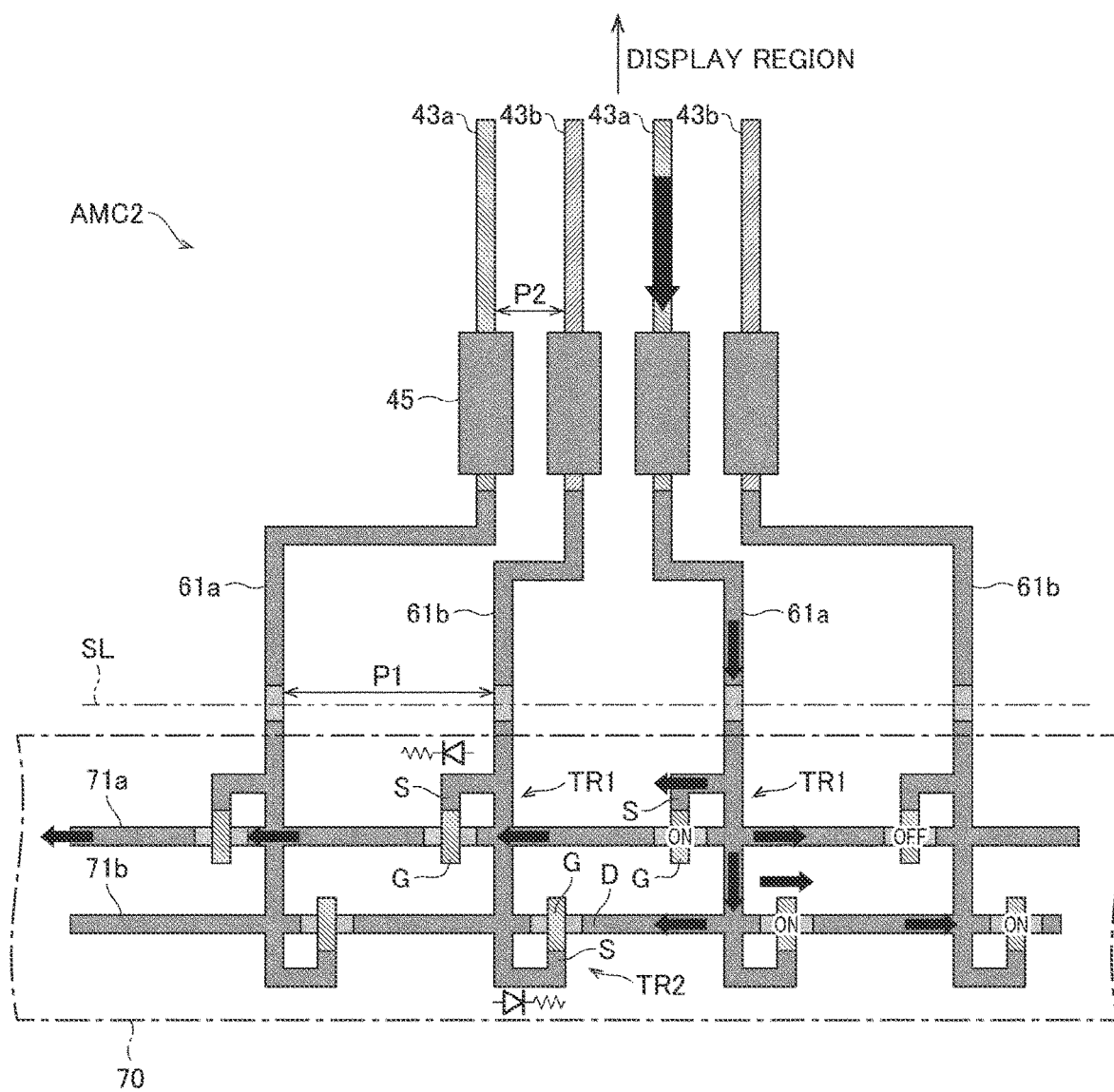
FIG. 5 is a plan view illustrating a configuration of a short ring of an active matrix substrate according to a second embodiment of the disclosure.
Figure 6:
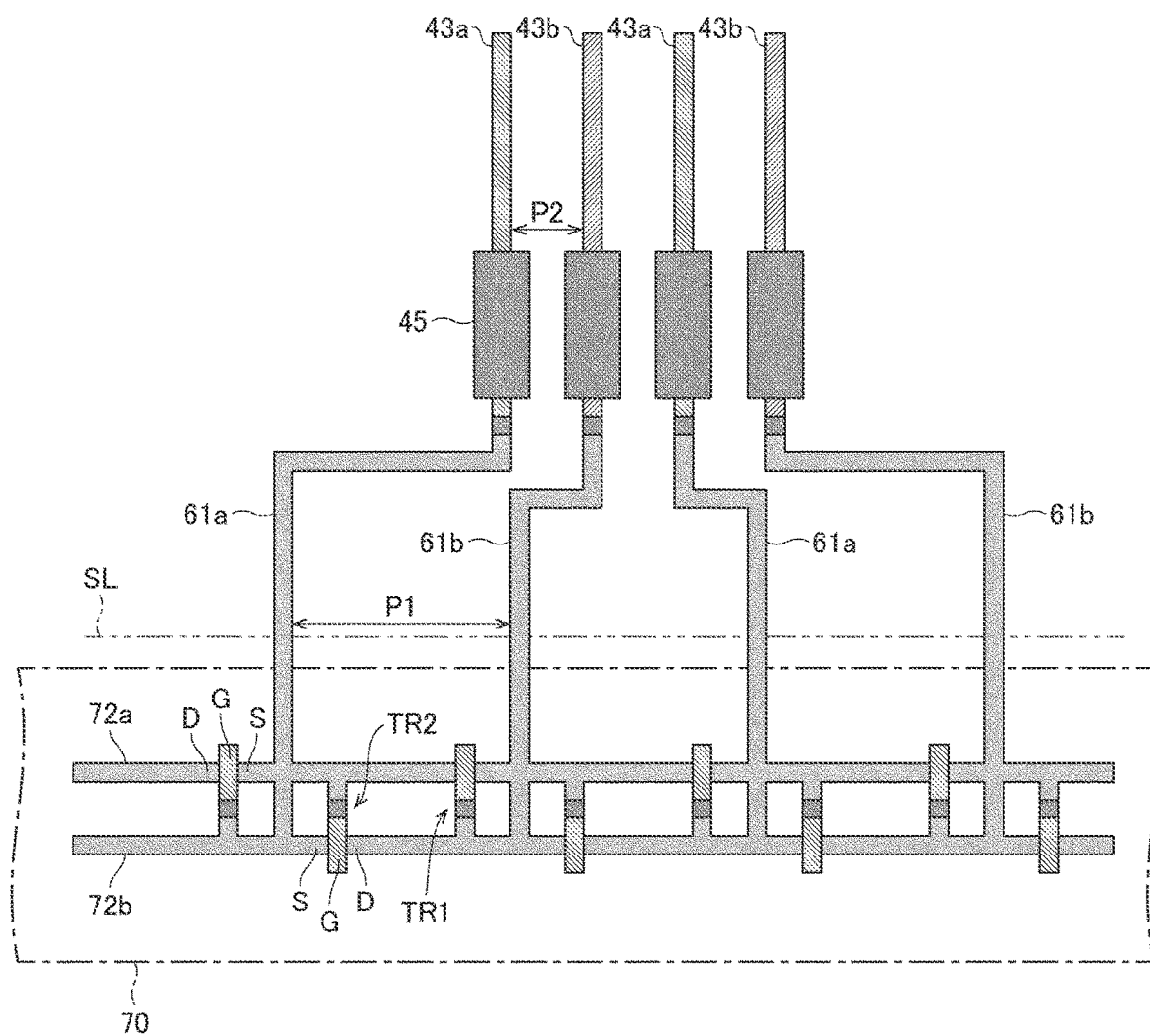
FIG. 6 is a plan view illustrating a configuration of a modification of the short ring of the active matrix substrate.

Hence, in the active matrix substrate AMC 2 of this embodiment as illustrated in FIG. 5, the short ring 70 is dual-redundant and includes the first short ring 71*a* and the second short ring 71*b*.

The active matrix substrate AMC 2 includes ring transistors TR1 and TR2 provided to the second lead wires 61*a* and 61*b* and formed between the separation line SL and the first short ring 71*a*. Each of the ring transistors TR1 and TR2 has a gate terminal G and a source terminal S electrically connected together.

The gate terminal G and the source terminal S of each of the ring transistors TR1 and TR2 are electrically connected together. Hence, the ring transistors TR1 and TR2 act as diode transistors, and keep a current from flowing from a drain terminal D toward the source terminal S.

As a result, even if static flows into the first short ring 71*a* and the second short ring 71*b* of one of the second lead wires 61*a* and 61*b*, the flowing static does not backflow into another one of the second lead wires 61*a* and 61*b*.

In particular, as illustrated in FIG. 5 of this embodiment, the first ring transistor TR1 is formed between the second lead wire 61*a* and the first short ring 71*a*. Furthermore, the second ring transistor TR2 is formed to have a source terminal S and a gate terminal G electrically connected to the second lead wire 61*b*, and a drain terminal D electrically connected to the second lead wire 61*a*.

Hence, in the first short ring 71*a*, the current flows only toward the left in FIG. 5. In the second short ring 71*b*, the current flows only toward the right in FIG. 5.

As a result, the dual-redundant first short ring 71*a* and second short ring 71*b* disperse the static therebetween, and conduct the static in the opposite directions. Such a feature makes it possible to efficiently disperse and reduce the static.

Note that FIG. 5 illustrates an example of the first ring transistor TR1 and the second ring transistor TR2 when the second lead wires 61*a* and 61*b*, the first short ring 71*a*, and the second short ring 71*b* are each formed of a metal film.

Alternatively, the second lead wires 61*a* and 61*b*, a first short ring 72*a*, and a second short ring 72*b* each can be made of a semiconductor. In such a case, the first ring transistor TR1 and the second ring transistor TR2 can be configured as illustrated in FIG. 6.

Figure 7:
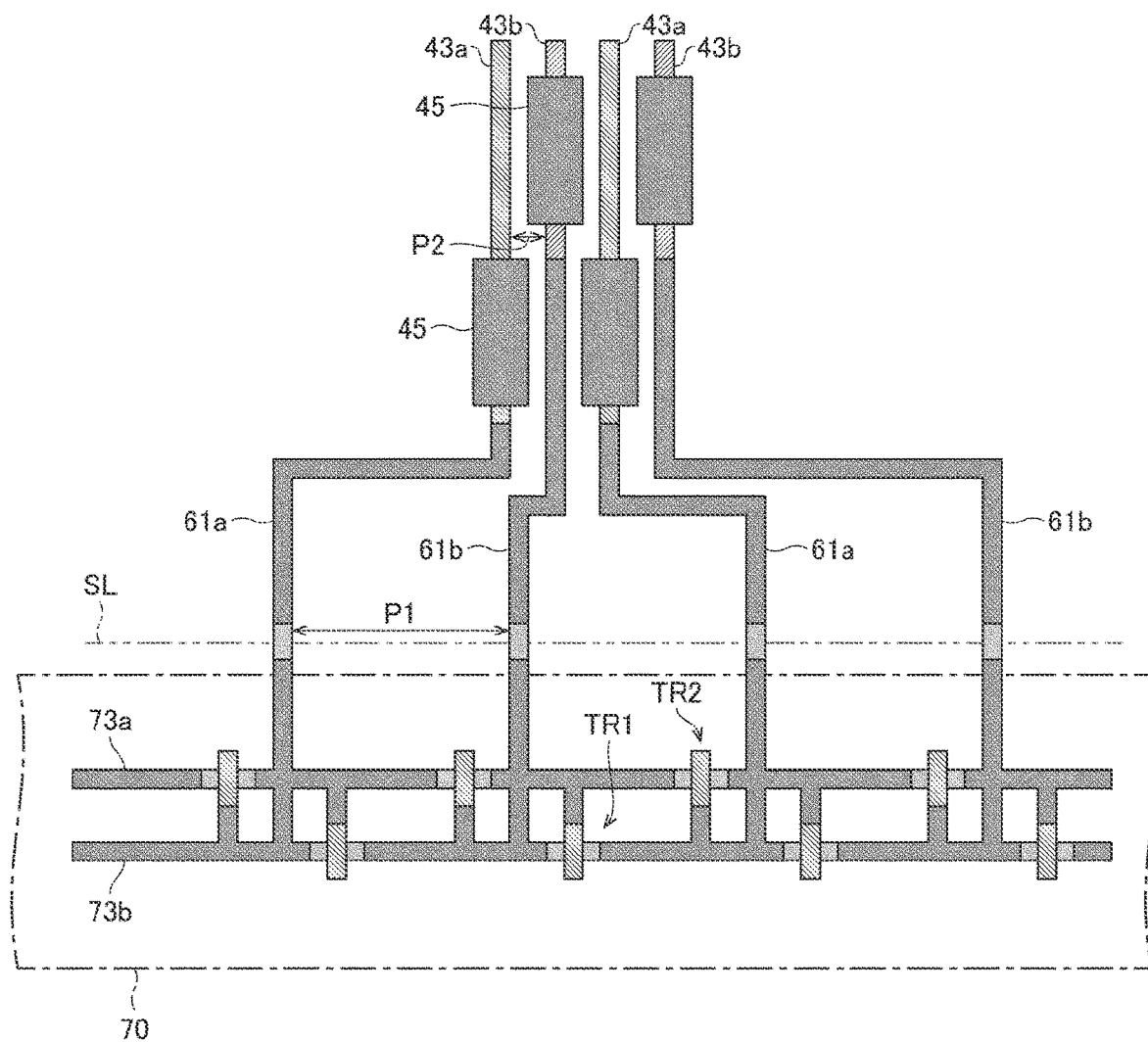
FIG. 7 is a plan view illustrating a configuration of an other another modification of the short ring of the active matrix substrate.

Furthermore, if the second lead wires 61*a* and 61*b*, a first short ring 73*a*, and a second short ring 73*b* are each formed of a metal film, the first ring transistor TR1 and the second ring transistor TR2 can be configured as illustrated in FIG. 7. Note that FIG. 7 illustrates an example in which the terminals 45 are staggered.

As can be seen, the active matrix substrate AMC 2 of this embodiment includes ring transistors; namely, the first ring transistor TR1 and the second ring transistor TR2 are provided to the second lead wires 61*a* and 61*b* and are formed between the separation line SL and the first and second short rings 73*a* and 73*b*. Each of the first ring transistor TR1 and the second ring transistor TR2 has a gate terminal G and a source terminal S electrically connected together.

Thus, even if the static flows from the terminals 45 through the second lead wires 61a and 61b, the current of the static does not flow toward the terminals 45 from the first ring transistor TR1 and the second ring transistor TR2. That is, the static does not backflow. Hence, even if the current of the static flows through the second lead wire 61a into the first short ring 73a and the second short ring 73b, the current does not backflow through the second lead wire 61b toward the terminals 45.

Hence, the static produced closer to the terminals 45 disperses only in one direction toward the first short ring 73a and the second short ring 73b, and does not backflow.

Moreover, in the active matrix substrate AMC 2 according to this embodiment, the short ring 70 is dual-redundant and includes the first short ring 73a and the second short ring 73b. The first ring transistor TR1 is formed between the neighboring second lead wires 61a and 61b, and having a source terminal S and a gate terminal G electrically connected to the second lead wire 61a and a drain terminal D electrically connected to the second lead wire 61b. The second ring transistor TR2 has a source terminal S and a gate terminal G electrically connected to the second lead wire 61b, and a drain terminal D electrically connected to the second lead wire 61a.

Thanks to such features, currents of the static flowing through the second lead wire 61a into the first short ring 73a and into the second short ring 73b flow in opposite directions. The currents flowing into the first short ring 73a and the second short ring 73b act on, and cancel out, each other. As a result, the static flowing into the first short ring 73a and the second short ring 73b can be efficiently reduced.

The source terminal S and the gate terminal G of the first ring transistor TR1 are respectively connected to the gate terminal G and the source terminal S of the second ring transistor TR2. Hence, when a current of large static flows to the source terminal S, the charges of the current also flow to the gate terminal G. As a result, the current is likely to flow from the source terminal S to the drain terminal D.

Hence, in this embodiment, the first ring transistor TR1 and the second ring transistor TR2 are more likely to conduct the current of the static as the static is larger. Such a feature allows the current to flow efficiently through the short ring 70, and, as a result, the static disperses efficiently.

Third Embodiment

Figure 8:
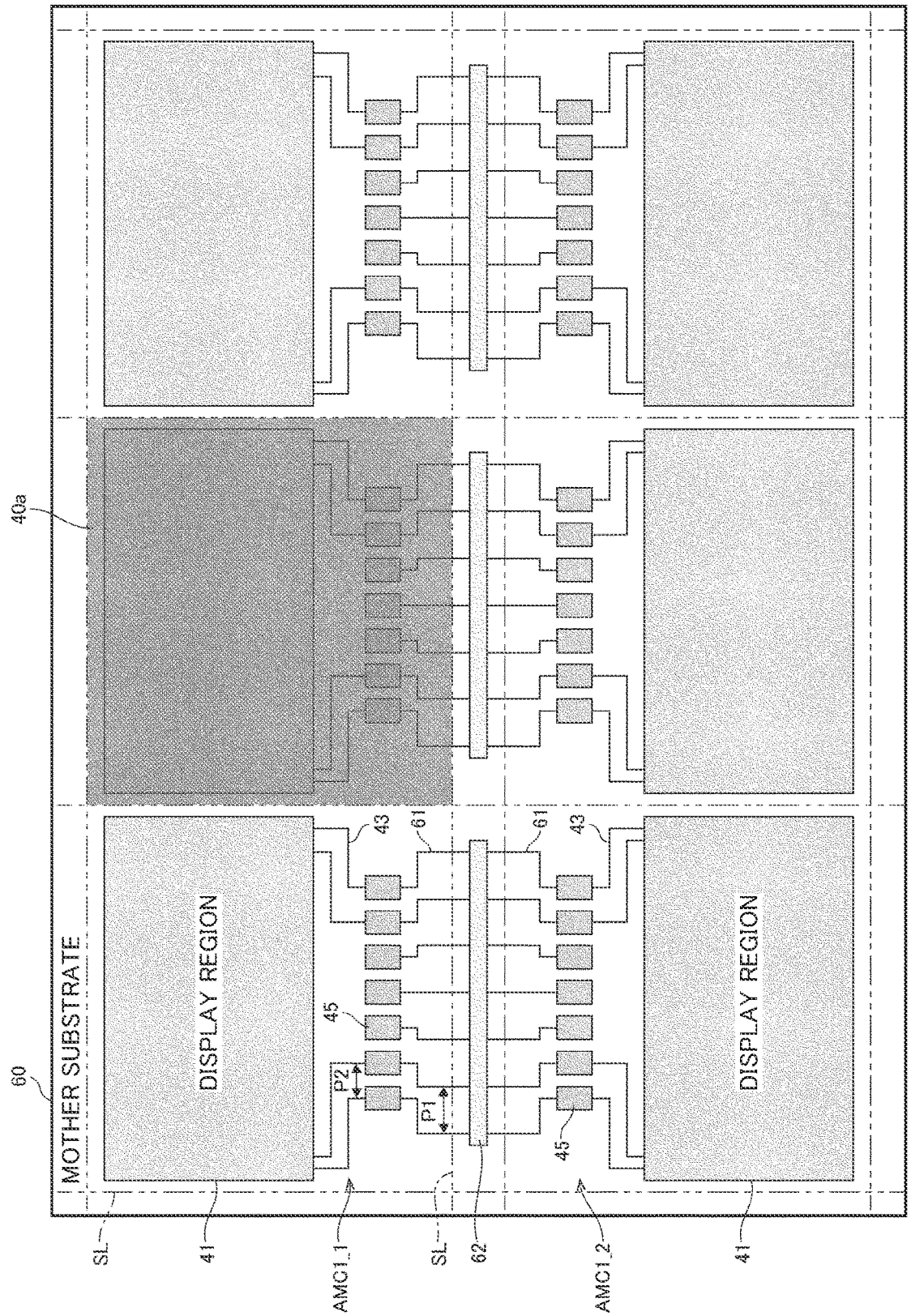
FIG. 8 is a plan view illustrating a configuration of a mother substrate, including a plurality of active matrix substrates, according to a third embodiment of the disclosure.

Described below is still another embodiment of the disclosure, with reference to FIGS. 8 to 10. This embodiment and the first embodiment share the same configurations except a configuration described in this embodiment. Like reference signs designate identical or corresponding components throughout the drawings between this embodiment and the first embodiment, and therefore will not be elaborated upon here.

A mother substrate of this embodiment includes a plurality of the active matrix substrates AMC 1 and the AMC 2.

Configurations of mother substrates 60 and 60' are described below, with reference to FIGS. 8 and 9. FIG. 8 is a plan view illustrating a configuration of the mother substrate 60 including the active matrix substrates AMC1. FIG. 9 is a plan view illustrating a configuration of a modification of the mother substrate 60; that is, the mother substrate 60' including the active matrix substrates AMC 2. Note that FIGS. 8 and 9 omit some of the first lead wires 43.

In manufacturing the active matrix substrates AMC1 and AMC 2, preferably used are the mother substrate 60 and the mother substrate 60' respectively including a plurality of the active matrix substrates AMC 1 and a plurality of the active matrix substrates AMC 2. Thanks to such a feature, the active matrix substrates AMC 1 and AMC are simultaneously manufactured in the same steps, improving efficiency in the manufacturing. Note that, in FIG. 8, the separation line SL coincides with the display panel end face 40a of the organic EL display device 1. That is, the separation line SL is the display panel end face 40a. Hence, the mother substrate 60 is divided by the separation line SL into individual display panels 40.

In such a case, for example, the short ring 62 is also preferably shared between the display panels 40. Hence, as illustrated in FIG. 8, for example, the mother substrate 60 of this embodiment includes a plurality of the active matrix substrates AMC 1 planarly arranged. The mother substrate 60 in FIG. 8 includes at least one active matrix substrate pair in which the terminals 45 of a first active matrix substrate AMC 1_1 and the terminals 45 of a second active matrix substrate AMC 1_2 are planarly arranged to face each other. The mother substrate 60 includes, for example, three such active matrix substrate pairs.

Such a feature makes it possible to manufacture at least one active matrix substrate pair from one mother substrate 60.

Moreover, in the mother substrate 60 according to this embodiment, one short ring 62 is provided in common with the terminals 45 of the first active matrix substrate AMC 1_1 and the terminals 45 of the second active matrix substrate AMC 1_2.

Hence, the static produced closer to the terminals 45 disperses only in one direction toward the short ring 62, and does not backflow. Moreover, one short ring 62 is provided in common with the first active matrix substrate AMC 1_1 and the second active matrix substrate AMC 1_2, making it possible to reduce the number of short rings 62.

Figure 9:
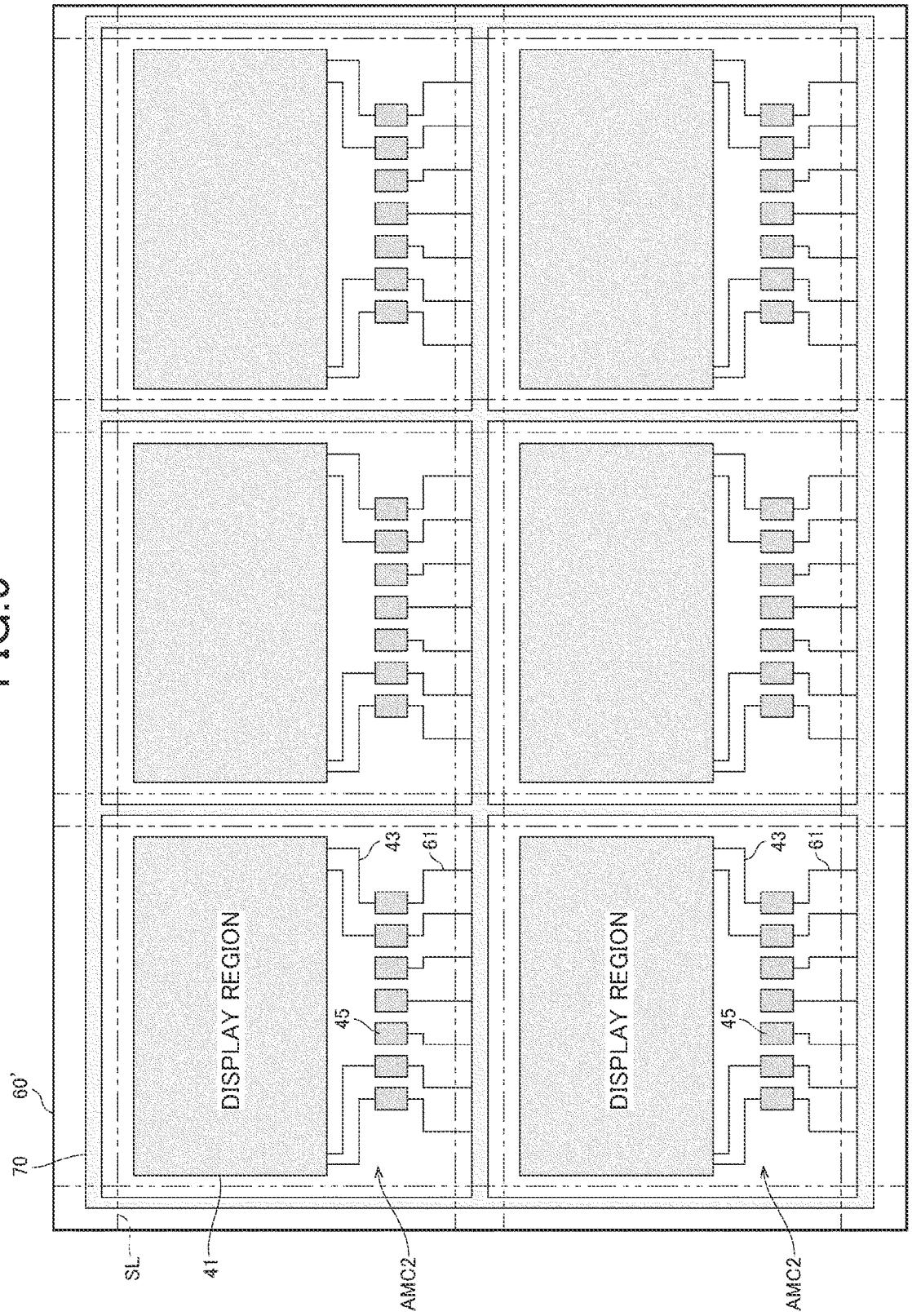
FIG. 9 is a plan view illustrating a configuration of a modification of the mother substrate including the active matrix substrates.

Here, as illustrated in FIG. 9, a modification of this embodiment; namely, the mother substrate 60', includes the short ring 70 shaped into frames each provided around one of the active matrix substrates AMC 2.

Hence, the short ring 70 runs in a long distance. As a result, when the static disperses from one of the second lead wires 61 to the short ring 70, the static travels through the long distance. Such a feature makes it possible to reduce a current of the static coming back to the terminals through another second lead wire 61.

In other words, the mother substrate 60' of this embodiment includes a plurality of the active matrix substrates AMC 2. Each of the active matrix substrates AMC 2 includes a short ring so that the second lead wires 61 of the matrix substrate AMC 2 extend across the separation line SL from the terminals 45 and connect to the short ring 70.

The active matrix substrate AMC 2 of this embodiment includes the short ring 70 shaped into a frame. Described here is the short ring 70 on a side, of the active matrix substrate AMC 2, not facing the terminals 45. FIG. 10 is a plan view illustrating a configuration of the short ring 70 on a side, of the active matrix substrate AMC 2, not facing the terminals 45. Note that FIG. 10 shows as an example of a conductor or a semiconductor to be extended when the active matrix substrate AMC 2 includes the first short ring 71a and the second short ring 71b in FIG. 5 of the second embodiment.

Figure 10:
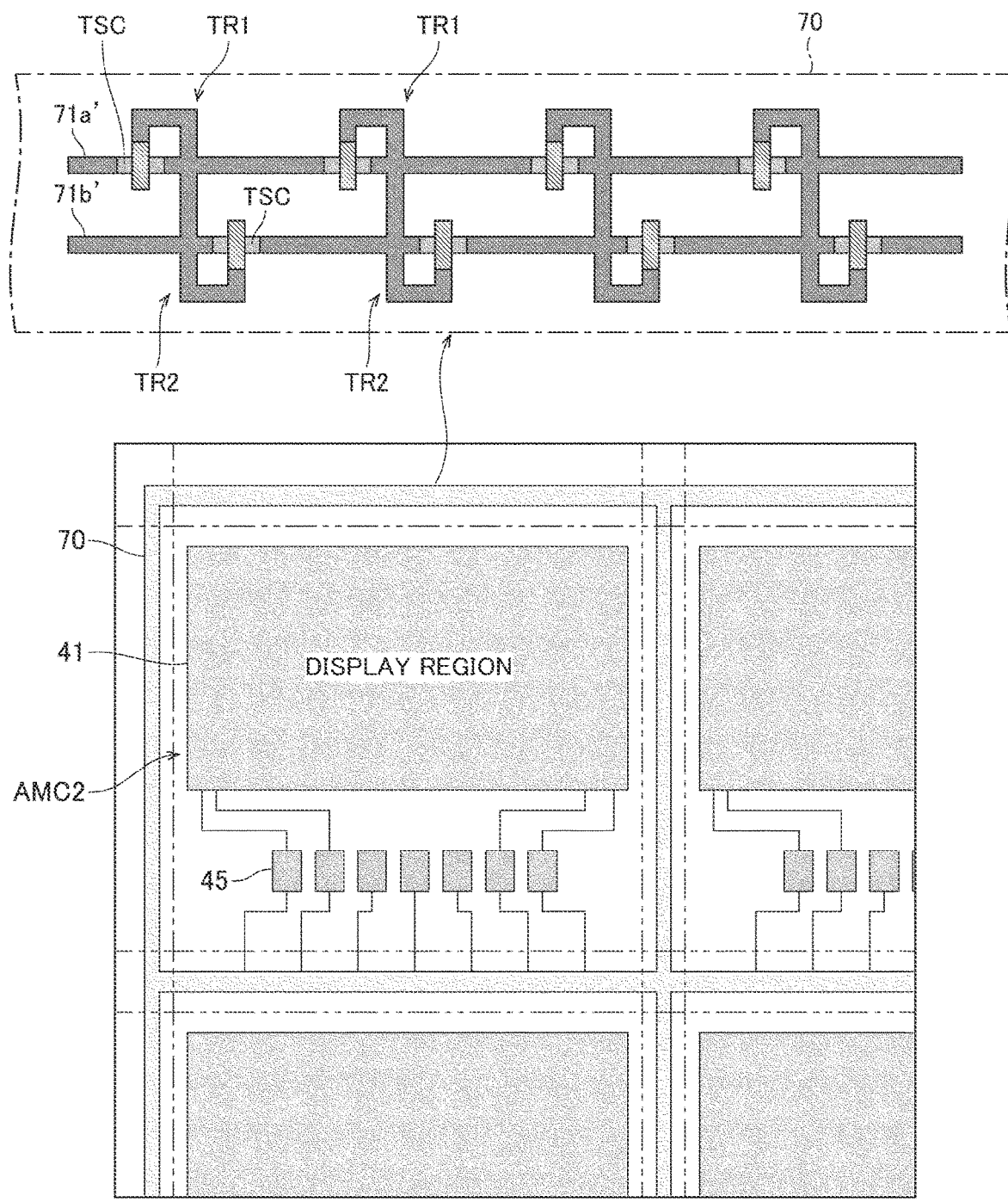
FIG. 10 is a plan view illustrating a configuration of a short ring on a side, of the active matrix substrate, not close to terminals.

FIG. 10 illustrates the side not facing the terminals 45 that act as external connection terminals of the active matrix substrate AMC2. The side is provided with a first connection wire 71a' and a second connection wire 71b' running in parallel with the side. The first connection wire 71a' and the second connection wire 71b' respectively extend from the first short ring 71a and the second short ring 71b illustrated in FIG. 5. Each of the first connection wire 71a' and the second connection wire 71b' partially includes an intrinsic semiconductor layer TSC. The intrinsic semiconductor layer TSC of the first connection wire 71a' includes: a first ring side transistor TR1 acting as a diode transistor and having a source terminal S and a gate terminal G of the first connection wire 71a' electrically connected together; and the intrinsic semiconductor layer TSC of the second connection wire 71b' includes a second ring transistor TR2 acting as a diode transistor and including a source terminal S and a gate terminal G of the second connection wire 71b' electrically connected together. Note that the side, of the active matrix substrate AMC 2, not facing the terminals 45 includes three sides other than a side, of the active matrix substrate AMC 2, having the terminals 45. Moreover, the intrinsic semiconductor layers TSC are not conductive.

Hence, the first short ring 71a, the first connection wire 71a', the second short ring 71b, and the second connection wire 71b' formed all around the AMC 2 disperse currents of static in opposite directions. Such a feature makes it possible to disperse the static more efficiently.

Note that, in the above example, only the first short ring 71a and the second short ring 71b illustrated in FIG. 5 correspond to the first connection wire 71a' and the second connection wire 71b'. However, the corresponding relationship in an aspect of the disclosure may include any given one. For example, the corresponding relationship may also be applicable to the first short ring 72a and the second short ring 72b illustrated in FIG. 6, and to the first short ring 73a and the second short ring 73b in FIG. 7.

Fourth Embodiment

Figure 11:
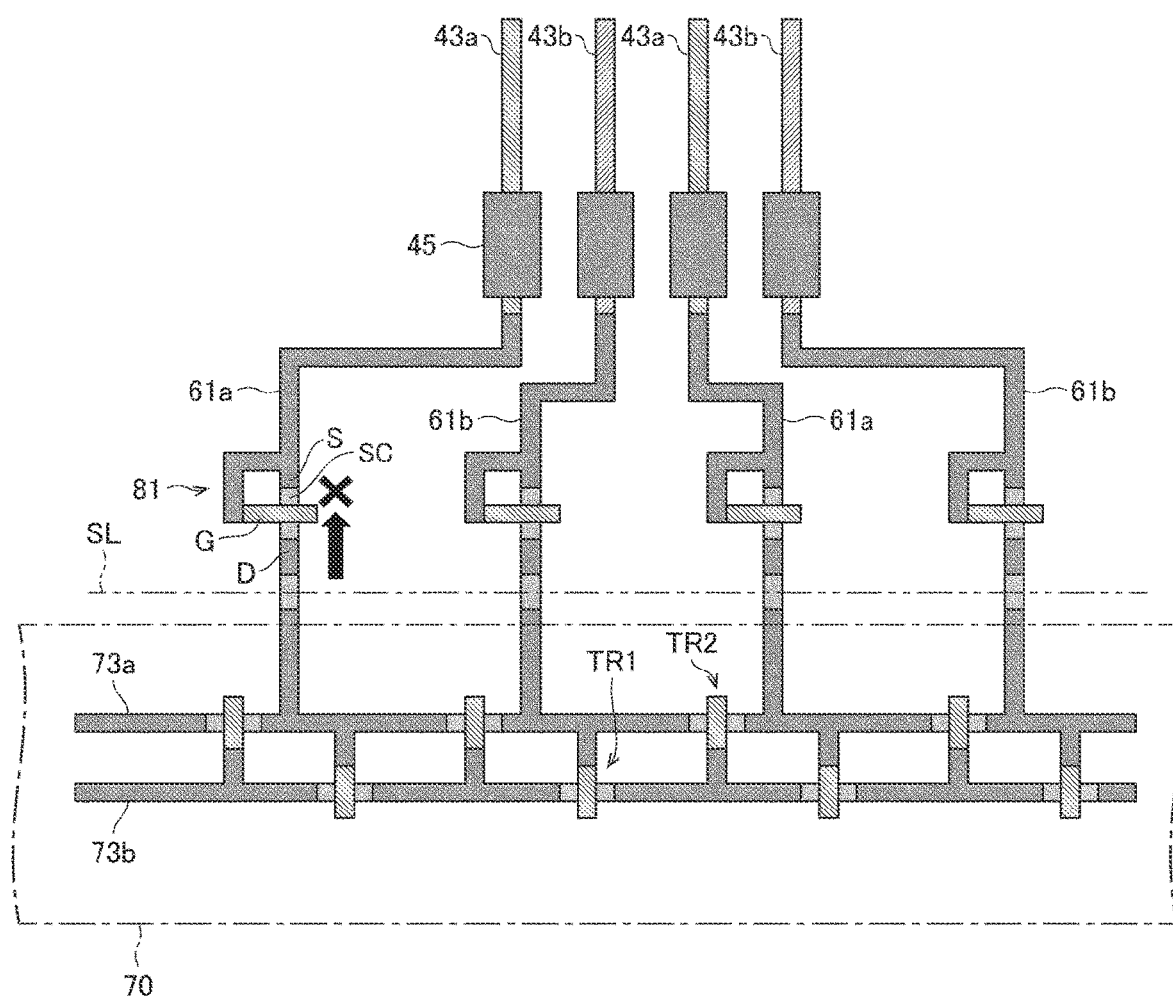
FIG. 11 is a plan view illustrating a configuration of an end of an active matrix substrate according to a fourth embodiment of the disclosure.

Described below is still another embodiment of the disclosure, with reference to FIG. 11. This embodiment and the first to third embodiments share the same configurations except a configuration described in this embodiment. Like reference signs designate identical or corresponding components throughout the drawings between this embodiment and the first to third embodiments, and therefore will not be elaborated upon here.

The active matrix substrate AMC 2 of this embodiment is different in that a terminal transistor is provided between the terminals 45 and the separation line SL.

Described below is a configuration of the active matrix substrate AMC 2 according to this embodiment, with reference to FIG. 11. FIG. 11 is a plan view illustrating a configuration of an end of the active matrix substrate AMC 2 according to this embodiment.

The active matrix substrate AMC 2 of this embodiment is the one illustrated in FIG. 7, and further includes a terminal transistor 81 between the terminals 45 and the separation line SL.

For example, when the short ring 70 is separated by the separation line SL across the second lead wires 61a and 61b, static might enter from an exposed portion of the second lead wires 61a and 61b. In this embodiment, the second lead wires 61a and 61b are partially formed of the semiconductor layer SC. Hence, the semiconductor layer SC, a part of the second lead wires 61a and 61b, is provided with: a terminal 45 as a source terminal S; a drain terminal D toward the separation line SL; and a gate terminal G above the semiconductor layer SC. Such a configuration forms a transistor. Moreover, in this embodiment, the terminal transistor 81 has the source terminal S and the gate terminal G electrically connected together. Hence, a current does not flow from the drain terminal D to the source terminal S.

As a result, even if static enters from the portion of the second lead wires 61a and 61b exposed on the separation line SL, the current of the static does not flow toward the terminals 45 from the terminal transistor 81.

Such a feature makes it possible to keep the static from coming toward the terminals 45 after the separation of the second lead wires 61a and 61b.

Note that, in the above example, the active matrix substrate AMC 2 illustrated in FIG. 7 is provided with the terminal transistor 81. However, in an aspect of the disclosure, the active matrix substrate AMC 2 shall not be limited to the one illustrated in FIG. 7. Alternatively, for example, the active matrix substrate AMC 2 illustrated in FIGS. 5 and 6 may also be provided with the terminal transistor 81.

Fifth Embodiment

Figure 12:
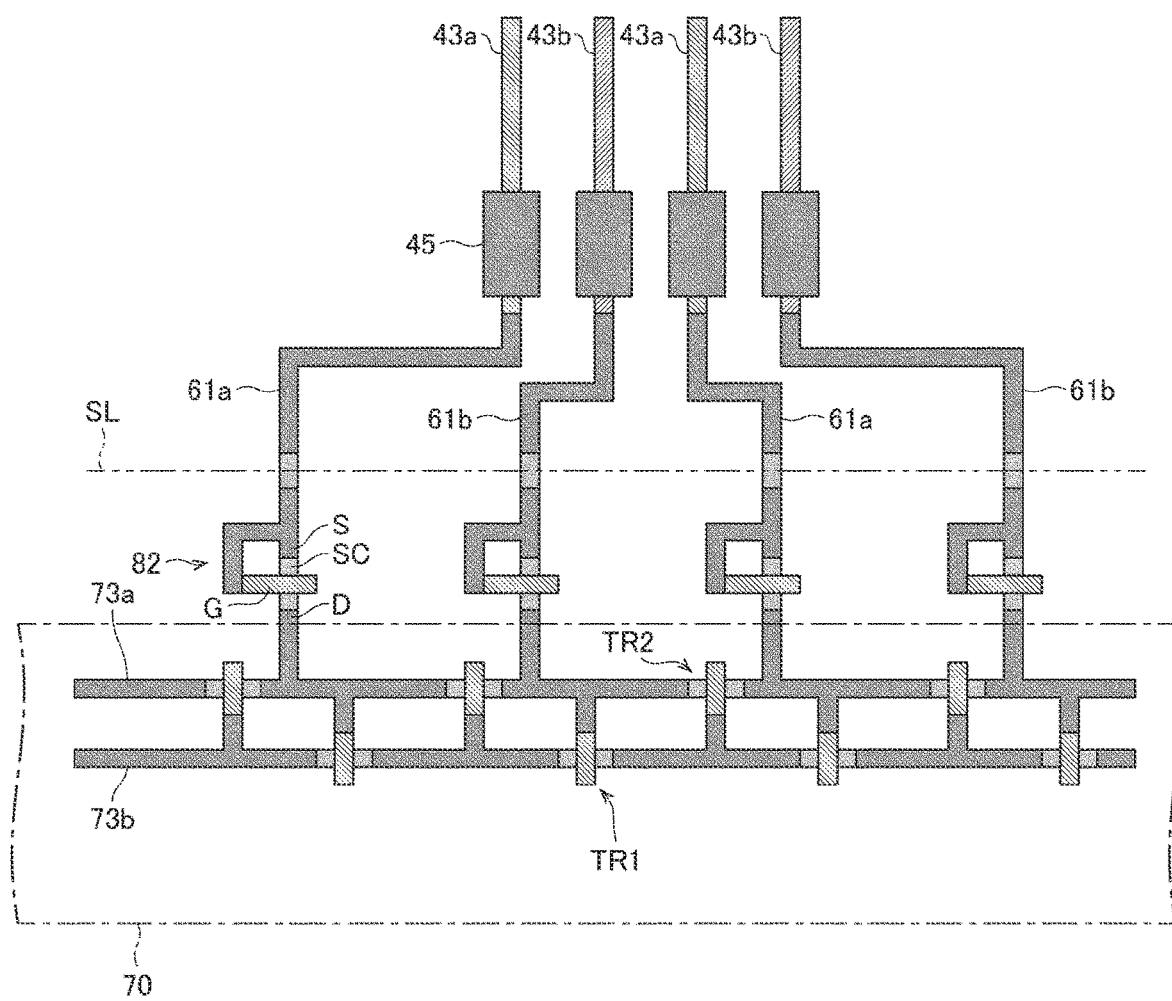
FIG. 12 is a plan view illustrating a configuration of an end of an active matrix substrate according to a fifth embodiment of the disclosure.

Described below is still another embodiment of the disclosure, with reference to FIG. 12. This embodiment and the first to fourth embodiments share the same configurations except a configuration described in this embodiment. Like reference signs designate identical or corresponding components throughout the drawings between this embodiment and the first to fourth embodiments, and therefore will not be elaborated upon here.

The active matrix substrate AMC 2 of this embodiment is different in that a terminal transistor is provided between the terminals 45 and the separation line SL.

Described below is a configuration of the active matrix substrate AMC 2 according to this embodiment, with reference to FIG. 12. FIG. 12 is a plan view illustrating a configuration of an end of the active matrix substrate AMC 2 according to this embodiment.

The active matrix substrate AMC 2 of this embodiment is the one illustrated in FIG. 7, and further includes a third ring transistor 82 between the separation line SL and the short ring 70.

In this embodiment, the second lead wires 61a and 61b are partially formed of the semiconductor layer SC. Hence, the semiconductor layer SC, a part of the second lead wires 61a and 61b, is provided with: a terminal 45 as a source terminal S; a drain terminal D toward the separation line SL; and a gate terminal G above the semiconductor layer SC. Such a configuration forms a transistor. Moreover, in this embodiment, the third ring transistor 82 has the source terminal S and the gate terminal G electrically connected together. Hence, a current does not flow from the drain terminal D to the source terminal S.

When static flows from one of the of the terminals 45 through a second lead wire 61a to the short ring 70, such a feature can prevent backflow of the static from the short ring 70 through a second lead wire 61b toward the terminals 45.

If the third ring transistor 82 is not provided, a route from one of the terminals 45 to the second lead wire 61a, to the short ring 70, to the second lead wire 61b, and to another terminal 45 should preferably be long in view of the prevention of the backflow of the static. However, the route should preferably be short in view of a space for installing the second lead wire 61a.

Hence, the active matrix substrate AMC 2 of this embodiment is provided with the third ring transistor 82, making it possible to reliably prevent the backflow of the static. As a result, the second lead wires 61a and 61b can be shortened between the terminals 45 and the separation line SL. Such a feature makes it possible to reduce a space for the second lead wires 61a and 61b between the terminals 45 and the separation lines SL, contributing to downsizing of the display panel 40.

Note that, in the above example, the active matrix substrate AMC 2 illustrated in FIG. 7 is provided with third ring transistor 82. However, in an aspect of the disclosure, the active matrix substrate AMC 2 shall not be limited to the one illustrated in FIG. 7. Alternatively, for example, the active matrix substrate AMC 2 illustrated in FIGS. 5 and 6 may also be provided with the third ring transistor 82.

SUMMARY

An active matrix substrate according to a first aspect of the disclosure includes a resin substrate including a plurality of external connection terminals arranged near a display region. The active matrix substrate includes: a plurality of first lead wires each extending from one of the external connection terminals to the display region; and a plurality of second lead wires each extending from one of the external connection terminals to a separation line. The second lead wires are arranged with an arrangement pitch along the separation line, and the arrangement pitch of the second lead wires is greater than an arrangement pitch of the first lead wires. Note that each second lead wire is separated in a predetermined position. The separation line is a line through which the separated lead wires are imaginarily connected together in the separated positions. Moreover, if the arrangement pitch of the first lead wires includes a plurality of arrangement pitches, and the arrangement pitch, of the second lead wires, along the separation line includes a plurality of arrangement pitches, the smallest pitches of the respective arrangement pitches are compared.

The active matrix substrate according to a second aspect of the disclosure may further include: a first inorganic insulating film and a planarization film stacked on top of another in a stated order on the second lead wires, the planarization film being made of resin; and a slit formed of the first inorganic insulating film along the separation line across the second lead wires in a plan view, the slit exposing the second lead wires. Along the separation line across the second lead wires in a plan view, the planarization film may fill the slit to cover the second lead wires.

The active matrix substrate according to a third aspect of the disclosure may further include a second inorganic insulating film formed below, and in contact with, the second lead wire. The resin substrate may be formed below the second inorganic insulating film.

In the active matrix substrate according to a fourth aspect of the disclosure, the second lead wires across the separation line may be conductive, and formed of the same material as a semiconductor layer is formed.

In the active matrix substrate according to a fifth aspect of the disclosure, the second lead wires may include a portion made of a metal film formed of the same material, and in the same layer, as a metal wire in the display region is formed.

The active matrix substrate according to a sixth aspect of the disclosure may further include a terminal transistor formed on the second lead wires and provided between the external connection terminals and the separation line. The terminal transistor may have a gate terminal and a source terminal electrically connected together.

A display apparatus according to a seventh aspect of the disclosure includes the active matrix substrate. The separation line coincides with an end face of a display panel included in the display device.

A mother substrate according to an eighth aspect of the disclosure includes a plurality of active matrix substrates planarly arranged and including the active matrix substrate.

In the mother substrate according to a ninth aspect of the disclosure, each of the active matrix substrates may include a short ring, so that the second lead wires of the active matrix substrate may extend across the separation line from the terminals and connect to the short ring. Note that the short ring, a conductor or a semiconductor, is provided to have all the terminals short-circuited, so that, when static is produced, the short ring discharges the static.

In the mother substrate according a tenth aspect of the disclosure, the short ring may be provided in common with neighboring active matrix substrates included in the active matrix substrates.

In the mother substrate according to an eleventh aspect of the disclosure, the short ring may be shaped into frames each provided around one of the active matrix substrates.

The mother substrate according to a twelfth aspect of the disclosure may further include a ring transistor provided to the second lead wires and formed between the separation line and the short ring. The ring transistor may have a gate terminal and a source terminal electrically connected together.

In the mother substrate according to a thirteen aspect of the disclosure, the short ring may be dual-redundant and includes a first short ring and a second short ring, and the ring transistor may include: a first ring transistor formed between neighboring second lead wires included in the second lead wires, and having a source terminal and a gate terminal electrically connected to one of the neighboring second lead wires and having a drain terminal electrically connected to another one of the neighboring second lead wires; and a second ring transistor having a source terminal and a gate terminal electrically connected to the other one of the neighboring, second lead wires, and a drain terminal electrically connected to the one of the neighboring second lead wires.

In the mother substrate according to a fourteenth aspect of the disclosure, each of the active matrix substrates may have a side not facing the external connection terminals. The side may be provided with a first connection wire, and a second connection wire may run in parallel with the side and respectively extend from the first short ring and second short ring. Each of the first connection wire and the second connection wire may partially include an intrinsic semiconductor layer including a diode transistor having a source terminal and a gate terminal, of the first connection wire and the second connection wire, electrically connected together. Note that the side, of the active matrix substrate, not facing the terminals includes three sides other than a side, of the active matrix substrate, having the terminals.

Note that an aspect of the disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the aspect of the disclosure. Moreover, the technical aspects disclosed in each embodiment may be combined to achieve a new technical feature.

The invention claimed is:
1. An active matrix substrate including a resin substrate having a plurality of external connection terminals arranged near a display region, the active matrix substrate comprising:

a plurality of first lead wires, each first lead wire extending from one of the plurality of external connection terminals to the display region; and a plurality of second lead wires, each second lead wire extending from one of the plurality of external connection terminals to a separation line, the plurality of second lead wires being arranged with an arrangement pitch along the separation line, and the arrangement pitch of the plurality of second lead wires being greater than an arrangement pitch of the plurality of first lead wires.

2. The active matrix substrate according to claim 1, further comprising:

a first inorganic insulating film and a planarization film stacked on top of one another in a stated order on the plurality of second lead wires, the planarization film being made of resin; and a slit formed of the first inorganic insulating film along the separation line across the plurality of second lead wires in a plan view, the slit exposing the plurality of second lead wires, wherein along the separation line across the plurality of second lead wires in a plan view, the planarization film fills the slit to cover the plurality of second lead wires.

3. The active matrix substrate according to claim 2, further comprising a second inorganic insulating film below, and in contact with, the second lead wire, wherein the resin substrate is below the second inorganic insulating film.

4. The active matrix substrate according to claim 3, wherein the plurality of second lead wires across the separation line are conductive, and formed of a same material as a semiconductor layer is formed.

5. The active matrix substrate according to claim 2, wherein the plurality of second lead wires include a portion that is made of a metal film formed of a same material, and in a same layer, as a metal wire in the display region is formed.

6. The active matrix substrate according to claim 1, further comprising a terminal transistor formed on the plurality of second lead wires and provided between the plurality of external connection terminals and the separation line, the terminal transistor having a gate terminal and a source terminal electrically connected together.

7. A display device, comprising the active matrix substrate according to claim 1, wherein the separation line coincides with an end face of a display panel included in the display device.

8. Another substrate comprising a plurality of active matrix substrates planarly arranged and including the active matrix substrate according to claim 1.

9. The mother substrate according to claim 8, wherein each of the plurality of active matrix substrates includes a short ring, so such that the plurality of second lead wires of the active matrix substrate extends across the separation line from the plurality of external connection terminals and connects to the short ring.

10. The mother substrate according to claim 9, wherein the short ring is provided in common with neighboring active matrix substrates included in the plurality of active matrix substrates.

11. The mother substrate according to claim 9, wherein the short ring is shaped into frames, each frame is provided around one of the active matrix substrates.

12. The mother substrate according to claim 9, further comprising a ring transistor provided to the plurality of second lead wires and formed between the separation line and the short ring, the ring transistor having a gate terminal and a source terminal electrically connected together.

13. The mother substrate according to claim 12, wherein the short ring is dual-redundant and includes a first short ring and a second short ring, and the ring transistor includes:

a first ring transistor formed between neighboring second lead wires that are included in the plurality of second lead wires, having a source terminal and a gate terminal electrically connected to one of the neighboring second lead wires, and having a drain terminal electrically connected to another one of the neighboring second lead wires; and a second ring transistor having a source terminal and a gate terminal electrically connected to the other one of the neighboring second lead wires, and a drain terminal electrically connected to the one of the neighboring second lead wires.

14. The mother substrate according to claim 13, wherein each of the plurality of active matrix substrates has a side not facing the plurality of external connection terminals, the side being provided with a first connection wire and a second connection wire running in parallel with the side and respectively extending from the first short ring and the second short ring, and each of the first connection wire and the second connection wire partially includes an intrinsic semiconductor layer including a diode transistor having a source terminal and a gate terminal of the diode transistor electrically connected together.

* * * * *